United States Patent
Prochnau et al.

(10) Patent No.: US 10,095,126 B2
(45) Date of Patent: Oct. 9, 2018

(54) MOVEABLY MOUNTED COMPONENT OF PROJECTION EXPOSURE SYSTEM, AS WELL AS DEVICE AND METHOD FOR MOVEMENT LIMITATION FOR SAME

(71) Applicant: Carl Zeiss SMT GmbH, Oberkochen (DE)

(72) Inventors: Jens Prochnau, Oberkochen (DE); Marwene Nefzi, Ulm (DE); Dirk Schaffer, Jena (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/659,205

(22) Filed: Jul. 25, 2017

(65) Prior Publication Data

US 2017/0357164 A1      Dec. 14, 2017

Related U.S. Application Data

(63) Continuation of application No. PCT/EP2015/080685, filed on Dec. 18, 2015.

(30) Foreign Application Priority Data

Jan. 26, 2015   (DE) .................... 10 2015 201 249

(51) Int. Cl.
  *G03B 27/42* (2006.01)
  *G03F 7/20* (2006.01)
  *G02B 7/182* (2006.01)
  *F16F 15/03* (2006.01)

(52) U.S. Cl.
  CPC ....... *G03F 7/70825* (2013.01); *G02B 7/1828* (2013.01); *G03F 7/709* (2013.01); *G03F 7/70975* (2013.01); *F16F 15/03* (2013.01)

(58) Field of Classification Search
  CPC ................. G03F 7/70825; G03F 7/70975
  USPC ................ 355/53, 72–76; 359/819–820
  See application file for complete search history.

(56) References Cited

U.S. PATENT DOCUMENTS

| | | |
|---|---|---|
| 6,522,392 B1 | 2/2003 | Mueller-Rissmann et al. |
| 2006/0230413 A1 | 10/2006 | Rassel et al. |
| 2013/0182236 A1* | 7/2013 | De Schiffart ......... B29C 43/021 355/74 |

FOREIGN PATENT DOCUMENTS

| | | |
|---|---|---|
| DE | 199 56 354 A1 | 6/2001 |
| DE | 10 2005 015 627 A1 | 10/2006 |
| DE | 10 2008 040 218 A1 | 1/2009 |
| DE | 10 2008 041 310 A1 | 3/2009 |
| DE | 10 2011 079 072 A1 | 3/2012 |
| DE | 10 2011 087 389 A1 | 7/2012 |
| DE | 10 2012 201 029 A1 | 7/2013 |

(Continued)

OTHER PUBLICATIONS

International Search Report for corresponding Appl No. PCT/EP2015/080685, dated Apr. 5, 2016.

(Continued)

*Primary Examiner* — Hung Henry Nguyen
(74) *Attorney, Agent, or Firm* — Fish & Richardson P.C.

(57) ABSTRACT

The present application discloses a component having a movably mounted component element of a projection exposure apparatus and in particular a movement limiting apparatus, and a method for limiting the movement of movable component elements of a component of a projection exposure apparatus.

21 Claims, 8 Drawing Sheets

(56) References Cited

FOREIGN PATENT DOCUMENTS

| | | | |
|---|---|---|---|
| DE | 102014104430 A1 * | 10/2015 | ......... G03F 7/70258 |
| JP | 2005-166996 A | 6/2005 | |
| WO | WO 98/055779 A1 | 12/1998 | |
| WO | WO 2012/013559 A1 | 2/2012 | |

OTHER PUBLICATIONS

German Office Action, with translation thereof, for corresponding Appl No. 10 2015 201 249.2, dated Sep. 7, 2015.
Fremerey et al., "Permanently magnetic bearings," Nov. 1, 2000, Section 7: Repulsive bearings, retrieved from the Internet: URL: http://www.fz-juelich.de/zea/zea-1//DE/_Shared.Docs/Downloads/magnet/Ob30_pdf.pdf?_blob=publicationFile [retrieved on Jul. 8, 2015]retrieved Jul. 8, 2015.
Translation of International Preliminary Report on Patentability for corresponding Appl No. PCT/EP2015/080685, dated Aug. 10, 2017.

\* cited by examiner

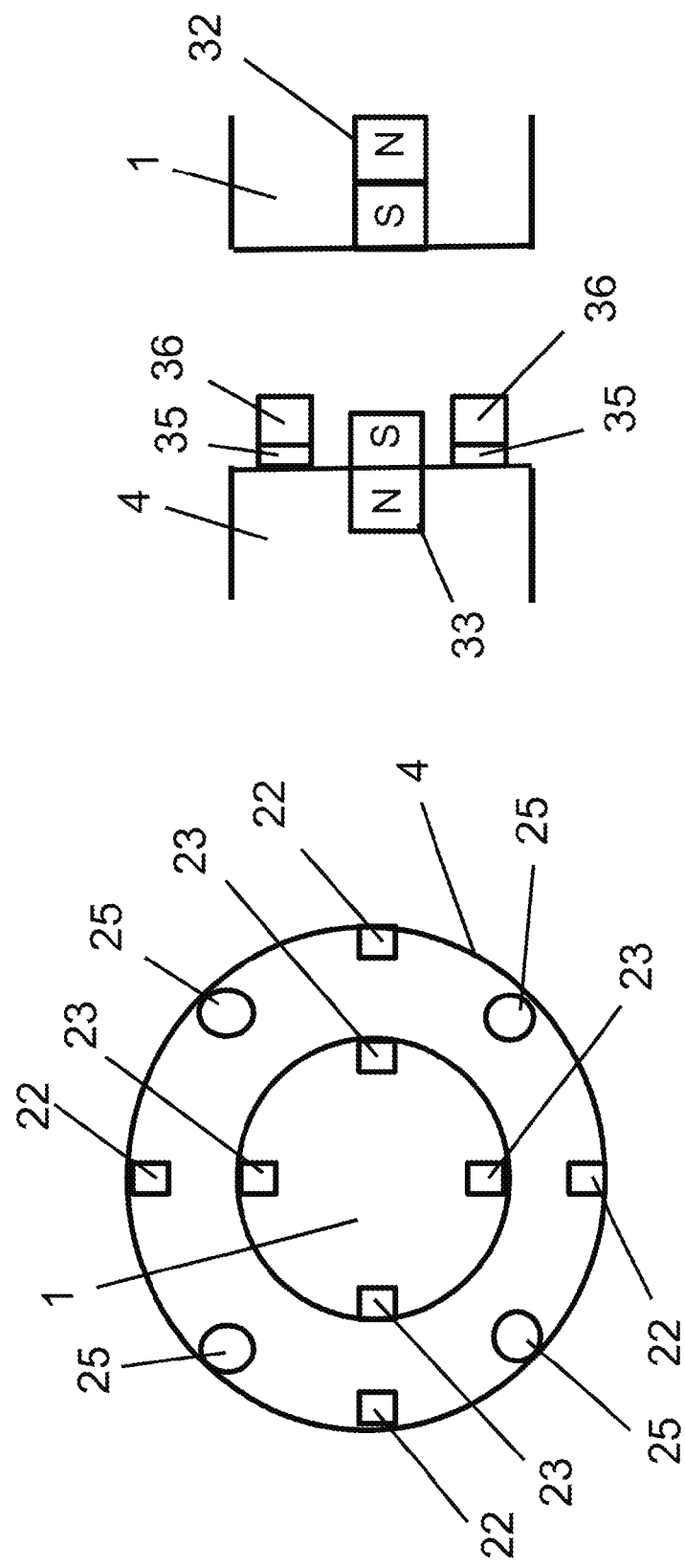

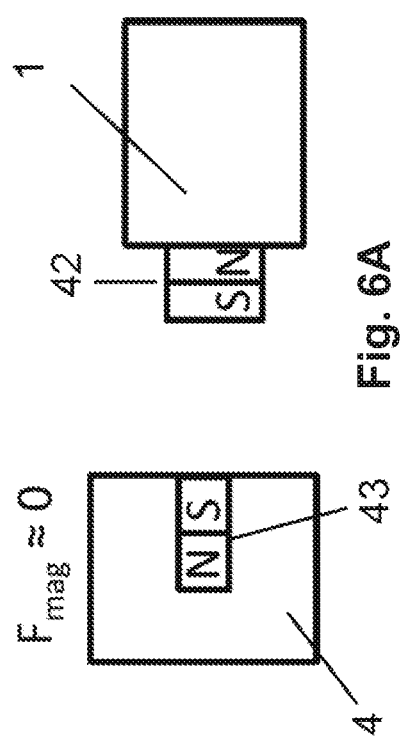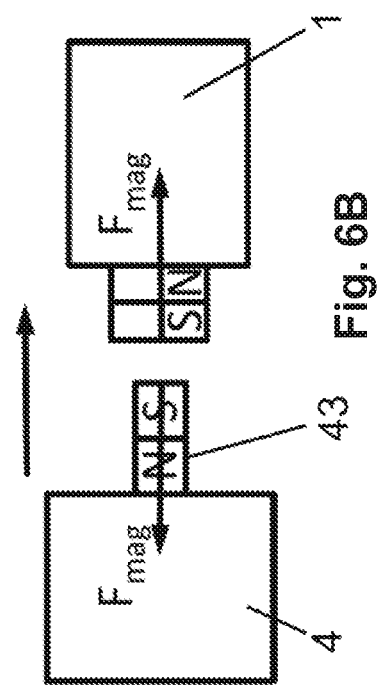

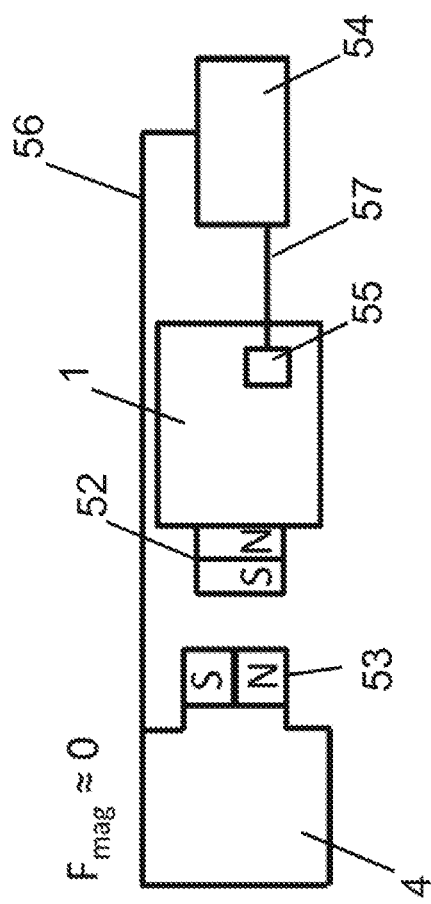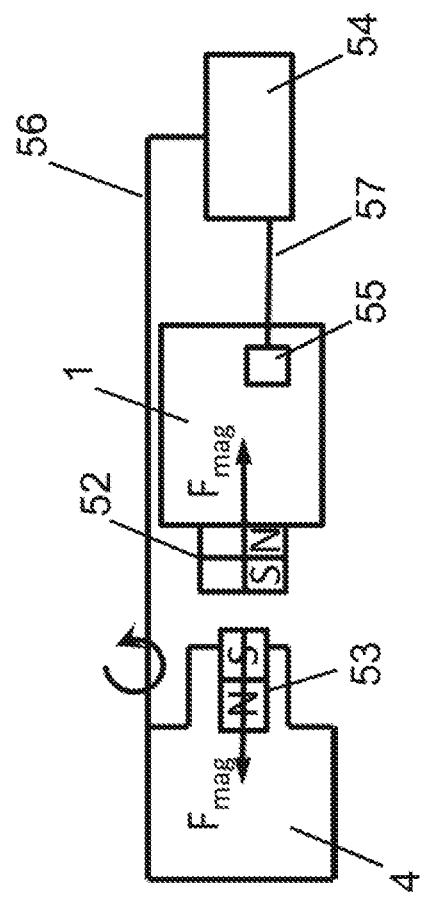

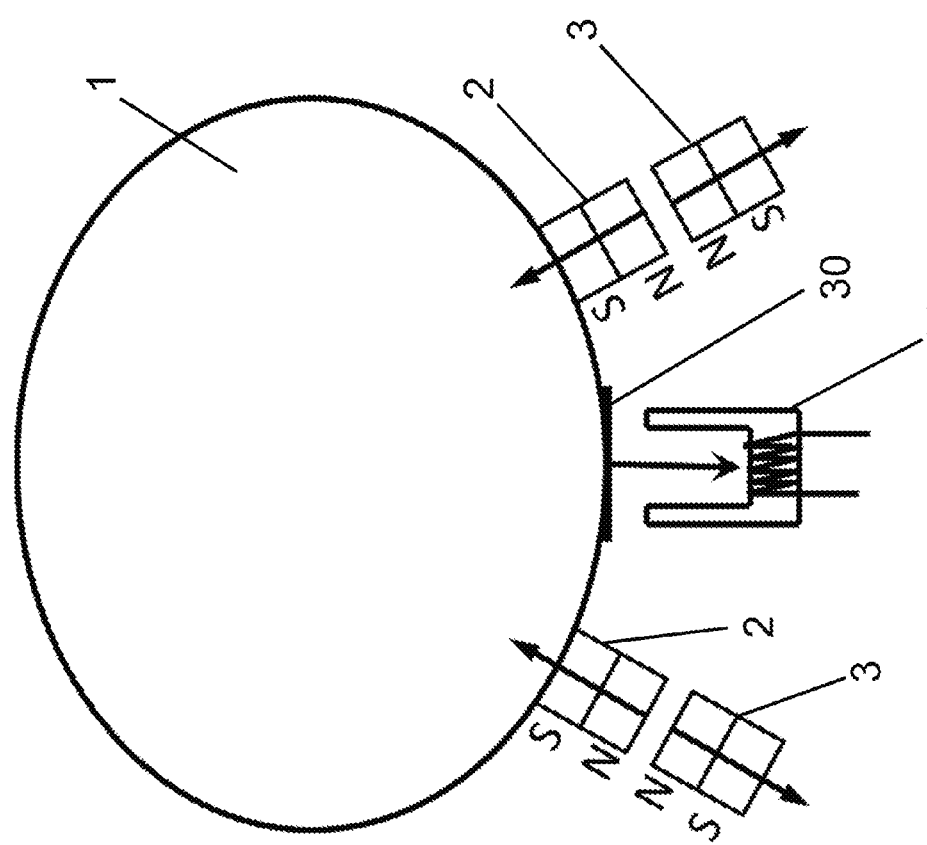

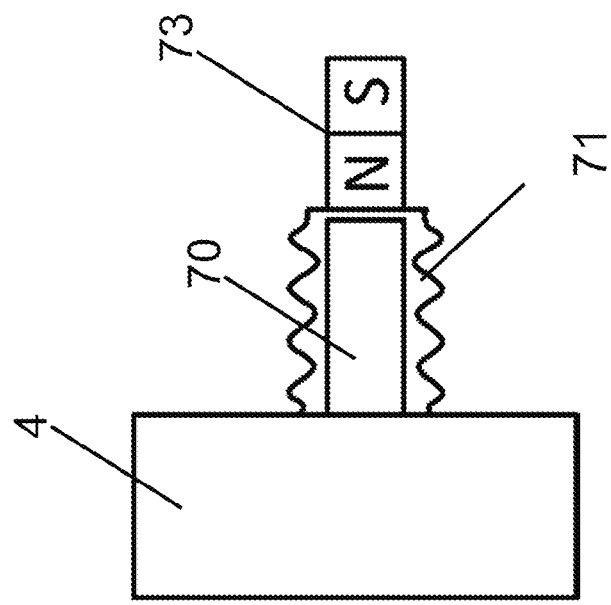
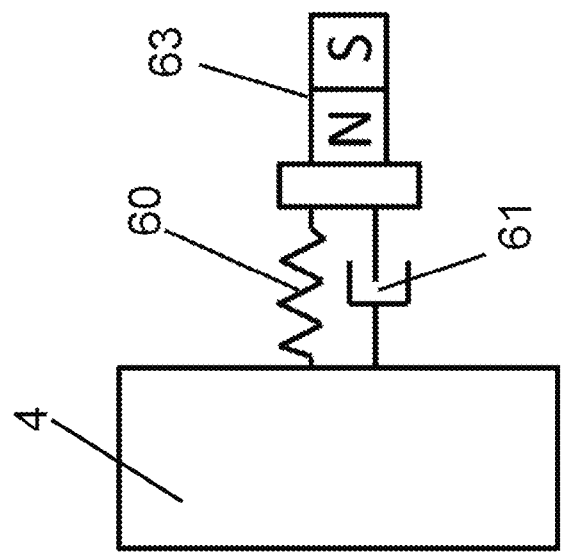
Fig. 10
Fig. 9

MOVEABLY MOUNTED COMPONENT OF PROJECTION EXPOSURE SYSTEM, AS WELL AS DEVICE AND METHOD FOR MOVEMENT LIMITATION FOR SAME

CROSS-REFERENCE TO RELATED APPLICATIONS

The present application is a continuation of, and claims benefit under 35 USC 120 to, international application PCT/EP2015/080685, filed Dec. 18, 2015, which claims benefit under 35 USC 119 of German Application No. 10 2015 201 249.2, filed Jan. 26, 2015. The entire disclosure of these applications are incorporated by reference herein.

FIELD

The present disclosure relates to a method and to an apparatus for limiting movement in movably mounted components of a microlithographic projection exposure apparatus.

BACKGROUND

Projection exposure apparatuses serve to image structures for the microlithographic creation of microstructured or nanostructured components in electrical engineering or microsystems technology. In such apparatuses, various components, such as optical elements, for example mirrors or the like, but also other components, such as fastening frames, actuator elements or the like, are mounted with a degree of movability, in order to example to avoid the transmission of oscillations through rigidly mounted components. However, in the case of movably mounted components, which can also be the to be softly mounted components, it is desirable for these components to be secured against excessive movement of the movable component elements as a result of unexpected external influences or during transport.

To this end, elements referred to as stop elements, referred to as end stops or transport securing means, are known, which can limit the range of movement of the movable component elements or fix the latter. In this way, it is possible to prevent the movable component elements from moving excessively and/or to prevent the movements thereof from building up and wide-ranging movements with a high speed of movement taking place as a whole, in the case of which damage to the component elements could occur in the event of a collision with adjacent component elements.

In addition to the end stops or fixing devices, or generally movement limiting apparatuses, there are damping elements in order to be able to dissipate the kinetic energy or oscillation energy in the system. Damping elements can also be combined with the end stops or fixing elements, for example by way of an appropriate configuration of the surfaces of the end stops or of the fixing means with elastic materials, such that, in the event of contact between a movable component element and an end stop damped with an elastic material, energy can be dissipated by the elastic deformation of the elastic material.

Examples of movement limiting apparatuses in projection exposure apparatuses are described for example in the German laid-open specification DE 10 2011 087 389 A1 and the international patent application WO 2012/013559 A1.

DE 10 2011 087 389 A1 describes a variable stop for an optical element, in which the stop is configured in an adjustable manner in order to allow the optical element, the movement of which is intended to be limited by the stop, to be positioned in different positions.

WO 2012/013559 A1 describes an arrangement and a method for damping shock loads in optical systems, wherein, in addition to mechanical stops which limit the range of movement of a movably mounted component element, induction arrangements are provided which induce electrical current in the event of a movement of the element of which the movement is to be limited, such that kinetic energy can be dissipated by the induction of electrical current and conversion of the electrical current into thermal energy. To this end, the induction arrangement has a magnetic plate which is arranged on the movable optical element, and a coil arrangement which is provided on a supporting structure, relative to which the optical element moves.

In WO 2012/013559 A1, the induction arrangement is additionally used as an actuator to deform the optical element, wherein, in this case, a magnetic field is generated at the coil arrangement by application of a suitable voltage and generation of a current flow, the magnetic field either attracting or repelling the magnetic plate on the optical element, in order for example to counteract a change in shape of the optical element as a result of gravitational influences. The induction arrangement is used only in the case of transport as a transport securing means in that the coil arrangement is short-circuited via a resistor such that a movement of the magnetic plate relative to the coil arrangement induces electrical current, wherein induced current is dissipated as heat via the resistor, such that the induction arrangement with the magnetic plate can function as a damping element.

However, in WO 2012/013559 A1, only passive damping in conjunction with mechanical stop elements is proposed, and so, although the speed at which the component element of which the movement is to be limited strikes the mechanical stop elements or the forces that occur when the movable component element butts against the stop elements can be reduced, mechanical contact can nevertheless take place, and this can result in damage to the component elements involved. As a result, although WO 2012/013559 A1 already provides some improvement in limiting movement and securing movable component elements in projection exposure apparatuses, the reduction in the impact energy that is to be dissipated upon mechanical contact between the movable component element and the stop elements may be unsatisfactory.

SUMMARY

The present disclosure seeks to provide a component having a movably mounted component element of a projection exposure apparatus and in particular a movement limiting apparatus, and a method for limiting the movement of movable component elements of a component of a projection exposure apparatus, which ensure that the risk of damage to components of a projection exposure apparatus through the action of externally occurring forces, for example in the event of earthquakes, handling errors or during transport, is minimal. A corresponding method for limiting movement is also intended to be easy to carry out and a corresponding apparatus is intended to be of simple construction and easy to handle.

In one aspect, the disclosure provides a method for limiting the movement of movably mounted component elements of a component of a microlithographic projection exposure apparatus. The component includes a component element and at least one bearing element which supports the component element and defines the position of the component element within a permissible range of movement. The method includes providing a movement limiting apparatus which limits the possibilities for changes in position of the component element outside a permissible range of movement. The movement limiting apparatus has a field generating device which has at least one first component, which is arranged on the component element of which the movement is to be limited, and at least one second component, which is arranged on a supporting structure with respect to which the movement of the movably mounted component element is intended to be limited. The first and the second component are at a distance from one another and a magnetic and/or electric field is generated by each of the first and the second component, such that at least one force field can be formed between the first and the second component. The method also includes setting the force field such that the force acting between the components is so small in normal operation that it has as little influence as possible on the positioning of the component element or this influence is minimized. At the same time, the force field is set such that, in the event of changes in position of the component element beyond the permissible range of movement as a result of undesired external forces, the change in position is counteracted by the force acting between the components.

In another aspect, the disclosure provides a component of a microlithographic projection exposure apparatus having a movably mounted component element, in particular for carrying out the method as claimed in one of the preceding claims. The component includes: a component element; at least one bearing element which supports the component element and defines the position of the component element within a permissible range of movement; and a movement limiting apparatus which limits the possibilities for changes in position of the component element outside the permissible range of movement. The movement limiting apparatus has a field generating device which has at least one first component, which is arranged on the component element of which the movement is to be limited, and at least one second component, which is arranged on a supporting structure with respect to which the movement of the movably mounted component element is intended to be limited. The first and the second component are at a distance from one another and a magnetic and/or electric field is generated by each of the first and the second component, such that at least one force field is formed between the components such that the force field counteracts the change in position of the component element at least outside the permissible range of movement. The force field is set such that the force exerted on the component element by the movement limiting apparatus is less than or equal to a limit value in normal operation. The limit value being selected so as to be less than a bearing force of the bearing element for the movable component element.

For a method for limiting the movement of movably mounted component elements of a projection exposure apparatus and a corresponding component, the disclosure proposes providing, instead of passive damping by way of a passive induction arrangement, at least one first component and at least one second component which each actively generate a magnetic and/or an electric field. The first component is arranged on a movable component element and the second component is arranged on a supporting structure which is arranged adjacent to the movable component element and with regard to which the movement of the component element is intended to be limited. Since both the first component and the second component of a corresponding movement limiting apparatus actively generate a magnetic and/or electric field, on account of the generated magnetic and/or electric fields, at least one force field is formed between the movable component element and the supporting structure, the force field being able to be used to limit the movement of the movable component element relative to the supporting structure and/or to fix the movable component element.

Specifically, a component according to the disclosure of a microlithographic projection exposure apparatus includes a movable component element, for example a mirror, some other optical element or the like, and at least one bearing element which supports the movable component element and defines the position of the component element within a permissible range of movement.

A corresponding bearing element can be realized in many different ways, for example by spring elements, actuators, in particular Lorentz actuators or the like, and combinations thereof. In this case, the term bearing element is also generally intended to include actuators which are used to influence the shape and/or position or orientation of the mounted component element. For example, in WO 2012/013559 A1, the optical element is used, by way of the induction arrangement made up of the magnetic plate and coil arrangement through which current flows, to counteract the sagging of the optical element in the middle of the optical element. Accordingly, such an arrangement of an actuator represents a bearing element within the meaning of the present disclosure, since the position of the optical element, including the shape, is influenced.

By way of the bearing element(s), the position of the movable component element within a reliable range of movement is defined, wherein position should be understood as meaning not only the arrangement of the component element in three-dimensional space but also a change in shape, caused by the bearing elements, of the component element or an orientation of the component element by rotation about independent spatial axes.

According to the disclosure, in addition to the at least one movable component element and the at least one bearing element, the component includes a movement limiting apparatus which limits the change in position of the component element outside a permissible range of movement. To this end, the movement limiting apparatus has at least one field generating device which has at least one first component, which is arranged on the component element of which the movement is to be limited, and at least one second component, which is arranged on a supporting structure with respect to which the movement of the movable component element is intended to be limited. Both the first and the second component, which are arranged adjacent to one another, generate a magnetic and/or electric field, such that at least one force field is formed between the field generating components and thus between the movable component element and the supporting structure. In this case, the force field is selected such that the force field counteracts a change in position of the component element outside a permissible range of movement on account of the action of external forces. However, at the same time, the force field is realized such that the changes in position of the component element that are permissible in normal operation are influenced as little as possible. In particular, the force acting between the components or the movable component element and the supporting structure can be less than or equal to a limit value in normal operation, the limit value being selected so as to be less than a bearing force of a bearing element or of a bearing arrangement made up of several or all of the bearing elements for the movable component element.

The externally acting forces can concern all forces which act in some way on the projection exposure apparatus and the components contained therein, such as forces during an earthquake, forces during transport of the projection exposure apparatus or parts thereof, or forces brought about by incorrect handling or the like. The changes in position of the movable component element that are brought about thereby include changes in the arrangement and/or orientation of the component element in three-dimensional space and changes to the shape of the component element. Changes in position can also be caused by induced natural oscillations.

The permissible range of movement of the movable component element is understood to be the range of movement of the component element through a desired change in shape and/or change in position and/or change in orientation of the component element, the range of movement being settable by the bearing elements in order to ensure desired imaging in the projection exposure apparatus.

The permissible range of movement also defines the normal operation of the movement limiting apparatus. Normal operation of the movement limiting apparatus is thus understood as being the state that the movable component element moves in the permissible range of movement and the securing case, i.e. exceeding of the permissible range of movement has not occurred. The normal operation of the movement limiting device can thus also be defined in that the distance between the first and the second component, which generate the magnetic and/or electric field, is greater than or equal to a target distance which is accordingly within the permissible range of movement. In other words, the distance between the field generating components is large enough in normal operation and there is no risk of any collision between the movable component element and the supporting structure.

The normal operation of the movement limiting device, or the question as to whether the movable component element is located within the permissible range of movement, can also be defined in that the acceleration of the component element is below a particular threshold value, since it should be assumed that the permissible range of movement has been left when the acceleration of the component element is above the corresponding threshold value.

In the same way, it is alternatively or additionally possible to determine, for example by way of force sensors, whether the acting external forces are above a limit or not. If the acting forces captured are below the limit, the movable component element and thus the movement limiting device are in normal operation. Accordingly, the securing case of the movement limiting apparatus, in which the movement limiting apparatus has to counteract the change in position of the movable component element, can be defined in that the distance between the movable component element and the supporting structure, or between the components which generate the magnetic and/or electric field, is smaller than a target distance, and/or in that the acceleration of the movable component element is greater than a threshold value, or the determined external force action is above a limit.

Although, according to the present disclosure, only at least one first component and at least one second component are used to generate magnetic and/or electric fields, the movement limiting apparatus can include several field generating components, in order, for example, to provide movement limiting not only in one effective direction, but also with regard to several or all degrees of freedom of movement.

The force field that results from the generation of the magnetic and/or electric fields by the field generating components is set such that the forces or force components, acting on the movable component element, of the movement limiting apparatus are so small that, in normal operation, the influence on the positioning of the component element is at a minimum, and, in particular with regard to the influence that the bearing elements exert on the position of the component element, is negligible.

In particular, the force field of the movement limiting apparatus in normal operation can be set such that the force exerted in an effective direction or resulting force is below a limit value which is less than a bearing force of a bearing element of the movable component element. This means that each individual attractive or repulsive force of components generating magnetic and/or electric fields or at least the resulting force in an effective direction of several field generating components is smaller than correspondingly each bearing force of an individual bearing element or a resulting bearing force of several bearing elements in an effective direction. Thus, it is possible to ensure that the influence of the movement limiting apparatus on the positioning of the movable component element in normal operation is negligible.

The limit value of the force exerted by the field generating components of the movement limiting apparatus in an effective direction can be kept below in normal operation by superposition of corresponding magnetic and/or electric fields. For example, in order to generate a force field, mutually repulsive permanent magnets can be arranged as field generating components, on which a magnetic field of an electromagnet is superposed in the opposite direction such that the resulting force between the field generating components or between the movable component element and the supporting structure is reduced into a range below the limit value, which is irrelevant with regard to the positioning of the movable component element.

Effective direction is understood here as meaning a resulting force in one of the independent spatial directions or a corresponding torque about one of the independent spatial directions.

In the securing case, when the state of normal operation has been left, the force field generated by the field generating components effects a force directed counter to the change in position of the movable component element, wherein the corresponding force field is automatically changed on account of the action of the external forces or an appropriate change is set.

An automatic change results for example when use is made, as field generating components, of permanent magnets which generate repulsive forces by way of like poles pointing toward one another, wherein, in the event of a reduction in the mutual distance, the repulsive forces accordingly increase on account of the reduction in distance, specifically proportionally to the square of the change in distance. Thus, in this case, the change from normal operation of the movement limiting apparatus, with little influence of the repulsive force on the positioning of the movable component element on account of the large distance between the permanent magnets, to the securing case, in which a significant force is exerted to increase the distance again, takes place automatically as a result of the corresponding action of the external forces and the automatic generation of the restoring forces.

Furthermore, however, it is also possible to use a control and/or regulating device in conjunction with correspondingly provided sensors to bring about a change in the field generating components in order to exert a force counteracting the change in position. Thus, for example, when use is made of electromagnets as field generating components, when a securing case is determined, i.e. a corresponding change in the position of the movable component element, the occurrence of a high acceleration and/or the occurrence of high external forces, the magnetic field of the electromagnet can be varied in a suitable manner by variation of the current flow through the electromagnet.

Furthermore, however, the field generating components can also be brought by mechanical adjustment into corresponding positions in which the field generating components bring about a changed force field which counteracts the change in position of the movable component element. Examples that should be mentioned here are movably mounted permanent magnets which can change the distance from another permanent magnet for example by displacement in order in this way to set different attractive or repulsive forces. In addition to movable mounting, in which the movement is realized by a movement in translation, the movable mounting can also allow a rotary movement such that for example permanent magnets can be oriented appropriately.

In the above-described embodiments of the movement limiting apparatus or of a correspondingly equipped component, it has merely been assumed that movement limiting has to take place in the event of an unusual event during operation of the component in the projection exposure apparatus, for example in the event of external influences as a result of an earthquake or handling errors or the like. However, the movement limiting apparatus according to the disclosure can serve not only for protection against excessive loads during operation but, in addition to the securing mode (i.e. securing during operation), can also be operated in a locking mode in which the projection exposure apparatus is not operated and the movement limiting apparatus is used to lock a movable component element, for example for precautionary locking during transport or maintenance. Accordingly, a distinction is made between the securing mode of the movement limiting apparatus and the locking mode of the movement limiting apparatus. In the securing mode, it is additionally possible to distinguish between normal operation and the securing case, which have already been described in detail above.

In order to switch the movement limiting apparatus into a locking mode, at least one of the components of the movement limiting apparatus that generate a magnetic field and/or electric field can be switched into a latching state such that a resulting force field is set, in a similar manner to the securing case in the securing state, such that the movability of the movable component element is considerably restricted. Correspondingly, in order to switch a field generating component into a latching state, the component is mechanically adjusted, for example displaced and/or rotated, in order, by way of the mechanical adjustment, for example by orienting or moving permanent magnets toward one another, to generate a force field which locks the movable component element. Alternatively or additionally, the electric or magnetic field generated by a component can be switched off and/or changed. Furthermore, a changed superposition of force fields that attract the movable component element relative to the supporting structure and/or repulsive force fields in order to set a locking state is conceivable.

The movement limiting apparatus can have several components that generate electric and/or magnetic fields, in particular several pairs of field generating components, which can interact suitably with one another in order to be able to limit the movement of the movable component element with regard to several degrees of freedom of movement. The field generating components can be formed by permanent magnets, electromagnets or electrodes. Furthermore, the movement limiting apparatus can include further elements, for example mechanical stop elements with or without elastic damping elements, or elements which can interact with field generating elements, for example ferromagnetic elements which can interact with permanent magnets or electromagnets.

In order to avoid oscillations, the field generating components can be mounted on the supporting structure and/or the movable component element via elastic elements and/or damping elements, such that acting forces can be dissipated by elastic deformation and/or corresponding damping. An element which works on the basis of a magnetorheological fluid can preferably be provided as damping element.

In particular, the field generating device of a movement limiting apparatus according to the disclosure can have at least one pair of interacting permanent magnets, which are oriented with like magnetic poles pointing toward one another such that a repulsive force is generated therebetween. Alternatively a pair made up of a permanent magnet and an electromagnet or a pair of electromagnets or a pair of mutually arranged electrodes can be used as interacting, field generating components in a movement limiting apparatus.

Preferably, a movement limiting apparatus, in addition to at least one pair of permanent magnets, can have an associated electromagnet in order for it to be possible to set the resulting magnetic field with the electromagnet. A corresponding electromagnet can also interact with a ferromagnetic plate in order to strengthen or weaken the force field generated by the permanent magnets or in order to fix the movable component element by superposition of repulsive and attractive forces.

In summary, a movement limiting apparatus for limiting the movement of a movably mounted component element can be operated such that it is possible to switch between a securing mode and a locking mode. In an embodiment variant without a switching possibility, the movement limiting apparatus is operated only in the securing mode.

In the securing mode, the movement limiting apparatus is operated in normal operation such that the forces that act on the movable component element and are provided by the movement limiting apparatus are negligible, such that the movable component element can be changed in position within particular defined ranges of movement by bearing elements. If a securing case occurs, i.e. the movable component element is impermissibly moved, accelerated or subjected to forces, the movement limiting device generates with its field generating device a force field which counteracts the impermissible movement, wherein this is initiated either automatically on account of the externally acting forces or a corresponding change in the field generating device is initiated by a control and/or regulating device.

If the movement limiting apparatus has the possibility of switching into a locking mode, the control and/or regulating apparatus can likewise execute a change in the field generating device such that one or more generated force fields are set such that the movable component element is limited in movement or fixed.

In this way, a contactless movement limiting apparatus is created which allows careful securing of movably mounted component elements.

BRIEF DESCRIPTION OF THE FIGURES

In the purely schematic appended drawings:

FIG. 4 shows an illustration of an arrangement of a movement limiting apparatus according to the disclosure in plan view;

FIG. 5 shows a further illustration in partial section of an arrangement of a movement limiting apparatus according to the disclosure;

FIG. 6a shows an illustration of a further embodiment of the interaction of two components of a movement limiting apparatus in the securing state;

FIG. 6b shows an illustration of a further embodiment of the interaction of two components of a movement limiting apparatus in the locking state;

FIG. 7a shows an illustration of a further embodiment of a movement limiting apparatus similar to the illustration in FIG. 6 in the switched-off state;

FIG. 7b shows an illustration of a further embodiment of a movement limiting apparatus similar to the illustration in FIG. 6 in the operating state;

FIG. 8 shows a further illustration of at least part of a movement limiting apparatus having two pairs of permanent magnets and an electromagnet in plan view;

FIG. 9 shows an illustration of the arrangement of a component of a movement limiting apparatus in the form of a permanent magnet;

FIG. 10 shows a further illustration of another embodiment of an arrangement of a permanent magnet of a movement limiting apparatus.

EXEMPLARY EMBODIMENTS

Further advantages, characteristics and features of the present disclosure will become clear from the following detailed description of the exemplary embodiments. However, the disclosure is not limited to these exemplary embodiments.

Figure 1:
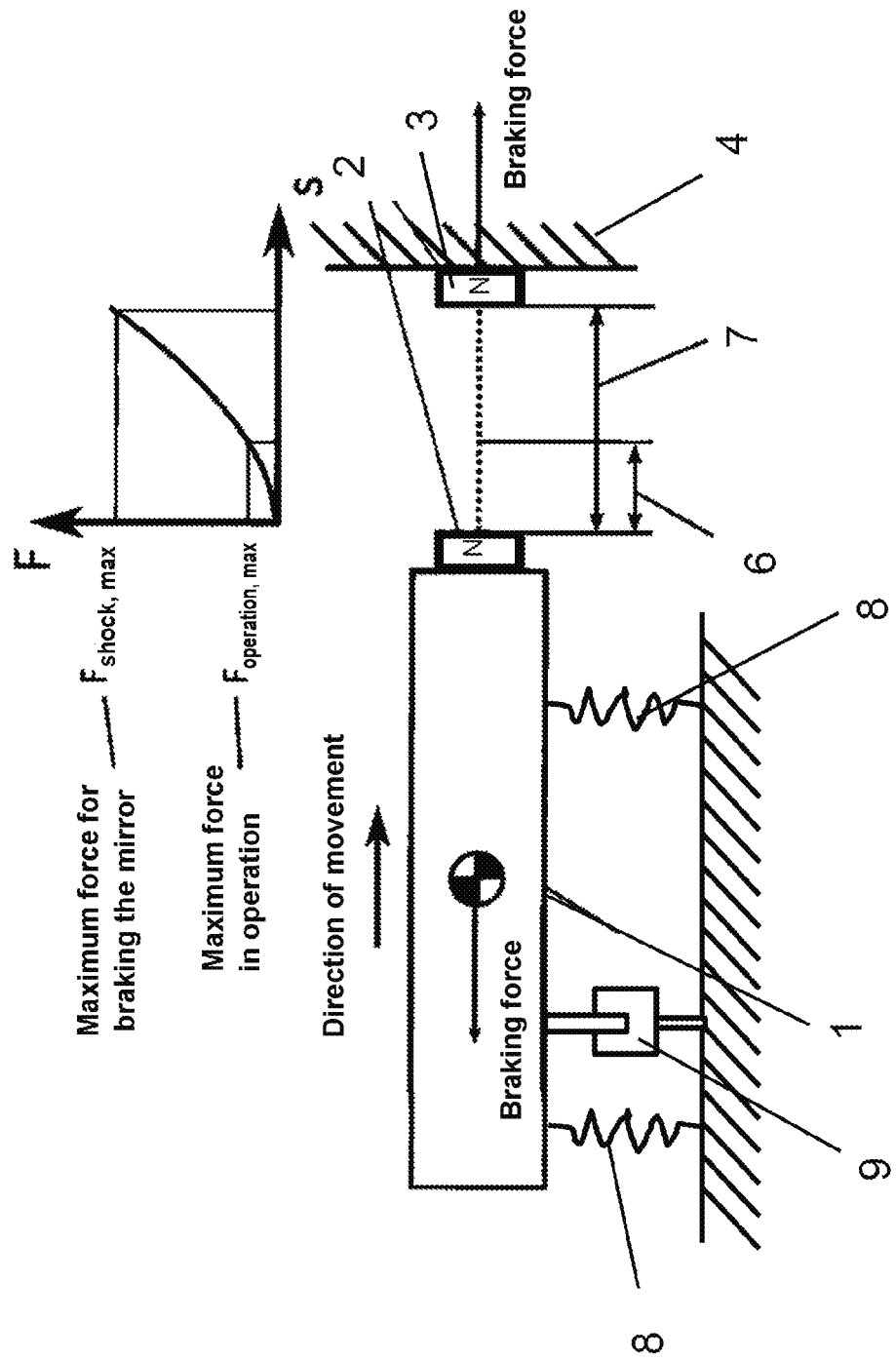
FIG. 1 shows a schematic illustration of the mode of action of the components of a movement limiting apparatus according to the disclosure and the force path in normal operation and in the securing case.

FIG. 1 shows, in a view in partial section, an illustration of the mode of action of a pair of components 2, 3 of a movement limiting apparatus according to the present disclosure. The movement limiting apparatus which is shown in FIG. 1 includes a movably mounted mirror 1, which represents the movable component element of which the movement is intended to be limited, specifically with regard to an adjacent supporting structure 4, which may be part of the frame or of the mount, for example, in which the mirror 1 is mounted via elastic bearing elements 8, for example. In addition to the elastic spring elements 8 as bearing elements, the component in the form of the mirror arrangement can furthermore have one or more actuators 9, for example Lorentz actuators, in order for it to be possible to correctly position or form the mirror 1 within a permissible range of movement. In this case, positioning can be both positioning in the narrower sense, in other words positioning in three-dimensional space and/or orientation of the mirror 1 in space, for example about corresponding axes of rotation, but also positioning in the broader sense, which includes a change in shape of the mirror 1. Within this meaning, the actuator 9 could effect a change in position of the mirror 1 in that a change in shape of the mirror 1 is brought about by the actuator 9 in order, for example, to correct imaging errors in a projection exposure apparatus in which the mirror arrangement in FIG. 1 is installed (see FIG. 11).

Accordingly, a change in position of the movable mirror 1 both with regard to the arrangement and orientation thereof in three-dimensional space and by way of a change in shape of the mirror 1 is possible via the actuator 9 shown or further actuators (not shown). The permissible range of movement 6, which is provided for example for correcting imaging errors, is symbolized in one dimension by the double arrow and the associated line. Within this permissible range of movement 6, which can also exist in other spatial directions (not shown) and/or with regard to the orientation of the mirror 1 about corresponding axes of rotation, movement of the mirror 1 is readily possible.

However, during transport of the projection exposure apparatus or during maintenance work on the projection exposure apparatus or on account of operating errors during operation of the projection exposure apparatus or for other reasons, external forces can be applied to the mirror 1, or the surrounding supporting structure 4 or the bearing arrangement with the bearing elements 8, with the result that the mirror 1 experiences an acceleration and thus relative movement with respect to the surrounding supporting structure 4, and so overloading of the bearing elements 8 and in the worst case a collision of the mirror 1 with the surrounding supporting structure 4 can occur, and this can result in damage in particular to the mirror 1. In FIG. 1, a single direction of movement of the mirror 1 is illustrated by way of example by the arrow pointing from left to right. However, it is obvious that movements in different directions or about different axes of rotation are possible.

In order, in the event of external impacts or shocks, to prevent the mirror 1 from striking the supporting structure 4 and exceeding the permissible range of movement 6, with the result that damage to the bearing elements 8 can occur, in the mirror arrangement in FIG. 1, a movement limiting apparatus is provided, which includes only two components 2, 3 in the schematic drawing shown in FIG. 1, the components 2, 3 being able to limit movement with regard to the direction of movement illustrated by the arrow in FIG. 1. To this end, the movement limiting apparatus has two permanent magnets 2, 3, of which only the north pole can be seen in each case. The permanent magnets 2, 3 are oriented with their north poles in each case facing one another, such that they exert a repulsive effect on one another. The ends of the permanent magnets 2, 3 are arranged at a distance 7 from one another which is greater than the permissible range of movement 6 within which the mirror 1 is movable in normal operation. As a result of the mutual repulsive effect of the permanent magnets 2, 3, if the permissible range of movement 6 is exceeded by the mirror 1, a restoring force is exerted on the mirror 1 on account of the repelling permanent magnets 2, 3, such that any further movement of the mirror 1 in the direction of the supporting structure 4 is counteracted.

To this end, FIG. 1 illustrates a force-displacement diagram which shows the braking force on the mirror 1 on account of the permanent magnets 2, 3, which are arranged on the mirror 1 (permanent magnet 2) and on the supporting structure 4 (permanent magnet 3), respectively. Since the repulsive force increases by the square of the decreasing distance 7 or of the distance covered by the movement of the mirror 1, when the mirror 1 approaches in the direction of the direction of movement indicated, the repulsive force increases such that an ever-increasing repulsive force is exerted between the permanent magnets 2 and 3, with the aid of which the mirror 1 can be prevented from approaching the supporting structure 4.

In this way, it is possible, for example with a corresponding mirror arrangement in FIG. 1, to prevent movable or softly mounted component elements, for example the mirror 1 shown in FIG. 1, from being set in motion too much during operation of the projection exposure apparatus as a result of applied external forces, for example shaking as a result of an earthquake or other influences, such that the bearing elements can be damaged by overloading and the mirror 1 itself can suffer damage when the mirror 1 butts against the adjacent supporting structure 4. As a result of the repulsive magnetic force of the permanent magnets 2, 3 with like poles pointing toward one another, a contactless end stop is thus realized, which can dissipate the energy introduced by the external forces at least partially in a contactless manner. However, at the same time, as can likewise be gathered from the diagram in FIG. 1, the free movability of the mirror 1 in the permissible range of movement 6 is not impeded, since the repulsive force of the permanent magnets 2, 3 in this range is very small and thus negligible.

The permanent magnets 2, 3 can each be replaced by electromagnets, specifically both individually and in pairs.

Figure 2:
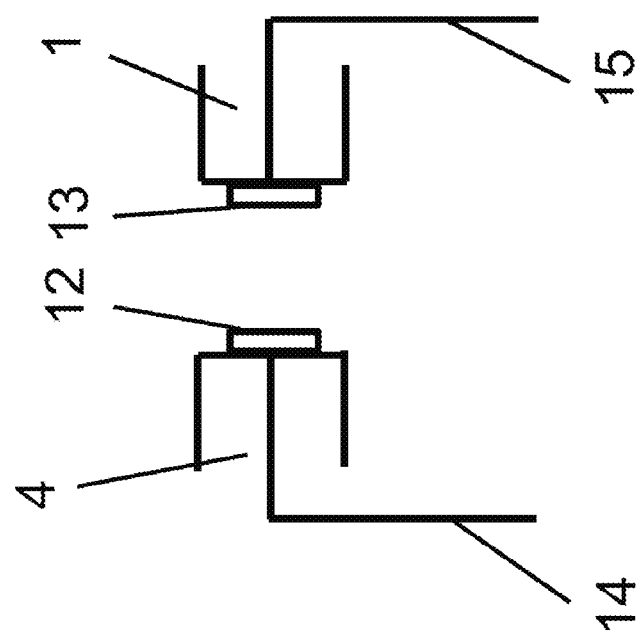
FIG. 2 shows an illustration of a further embodiment of components of a movement limiting apparatus according to the disclosure.

Instead of the variant shown in FIG. 1 with permanent magnets 2, 3 oriented in a mutually repulsive manner, the movement limiting apparatus according to the embodiment in FIG. 2 can also use electric fields to generate a force field. FIG. 2 again shows a partial section through an optical element, such as a mirror 1, and a supporting structure 4, provided adjacent thereto, which is separated from the mirror 1 by a gap. At the side walls which bound the gap between the mirror 1 and the supporting structure 4, electrodes 12, 13, which can be subjected to an electric charge via corresponding electric lines 14, 15, are provided in the embodiment in FIG. 2. For example, the two electrodes 12, 13 can be subjected to a positive or negative charge, such that a force field is formed which exhibits repulsive forces between the mirror 1 and the supporting structure 4, or between the electrodes 12, 13 which are arranged on the supporting structure 4 and mirror 1. Accordingly, it is also possible, in the embodiment in FIG. 2, for a force to be exerted on the mirror 1 in the securing case, that is to say when external forces act on the mirror 1 such that the latter is accelerated or moved relative to the supporting structure 4, the force counteracting a reduction in the distance between the electrodes 12, 13 in order in this way to brake the movement of the mirror 1 in the direction of the supporting structure 4.

Figure 3:
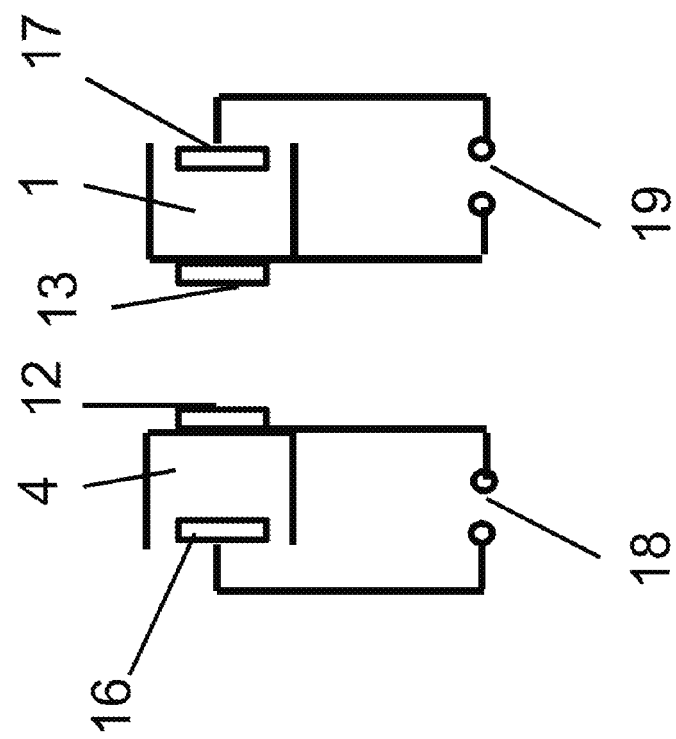
FIG. 3 shows a third illustration of an embodiment of components of a movement limiting apparatus according to the disclosure.

FIG. 3 shows a further embodiment, in which the electric fields are used to generate a force field for the movement limiting apparatus. In the exemplary embodiment shown in FIG. 3, the electrodes 12, 13, which are arranged on the side walls of the mirror 1 and the supporting structure 4, the side walls bounding the gap between the mirror 1 and supporting structure 4, are parts of capacitors which are formed on the mirror 1 and on the supporting structure 4, respectively. The electrode 13 on the mirror 1 has a counter electrode 17 and a voltage source 19, while the electrode 12 on the supporting structure 4 is assigned a counter electrode 14 and a voltage source 18. As a result of the capacitors being charged such that the electrodes 12, 13 form like poles, i.e. for example positive poles or negative poles, a repulsive force field can again be generated such that repulsive forces are present between the supporting structure 4 and the mirror 1, which counteract undesired approaching of the mirror 1 and supporting structure 4 under the action of external forces.

FIG. 4 shows, in a further illustration, a further embodiment of the component according to the disclosure having a movement limiting apparatus, specifically in the form of a plan view rather than the side views in partial section shown in FIGS. 1 to 3.

FIG. 4 shows a circular mirror 1, on the circumference of which a plurality of permanent magnets 23 are arranged at an angular spacing of 90°. The mirror 1 is surrounded by a supporting structure 4, likewise formed in a circular manner, in the form of a frame. Arranged opposite the permanent magnets 23 on the supporting structure 4 are likewise a plurality of permanent magnets 22, which are accordingly oriented such that like poles of the permanent magnets on the supporting structure 4 and of the permanent magnets 23 on the mirror 1 point toward one another such that repulsive forces are formed. If the mirror 1 is now displaced out of its central position in the middle of the supporting structure 4 by external forces, the repulsive forces between the permanent magnets 22 and 23 generate a force component which moves the mirror back into the central position. On account of the low repulsive forces between the permanent magnets 22 and 23 within the predetermined distance range, it is possible for the mirror 1 to move in a limited range around the central position.

In addition to the permanent magnets 22, 23, the movement limiting apparatus in the embodiment in FIG. 4 additionally includes mechanical stop elements 25, which are likewise arranged around the inner circumference of the supporting structure 4 and act as end stops if the repulsive magnetic forces of the permanent magnets 22, 23 are insufficient to avoid a collision between the mirror 1 and the surrounding supporting structure 4. As a result of the repulsion of the mirror 1 with respect to the supporting structure 4 by the permanent magnets 22, 23 and the braking of the mirror 1 that is brought about thereby, the striking speed and the resultant striking forces are reduced, however, such that damage to the mirror and/or the supporting structure 4 can be avoided, even when the mirror 1 butts against the stop elements 25.

FIG. 5 shows, in a side view in section, a further exemplary embodiment of a movement limiting apparatus having a combination of mechanical stop elements 35, 36 and permanent magnets 32, 33 in the region of the gap between a mirror 1 or some other movably mounted component element and a supporting structure 4. The mechanical stop elements include a holder 35 and elastic stop elements 36, made for example of a rubber-like material, in order to cushion the striking of the mirror 1 in the securing case.

In the exemplary embodiments in FIGS. 1 to 5, movement limiting apparatuses have been described in conjunction with components according to the disclosure or parts thereof, which serve mainly to exert as far as possible no forces, or only minor forces, in named operation on the component element of which the movement is to be limited, for example the mirror 1, and only in the securing case, when external forces result in acceleration and movement of the component element of which the movement is to be limited, to provide forces directed counter to the acceleration or movement.

Furthermore, in addition to the above-described securing mode, a movement limiting apparatus according to the present disclosure can additionally be operated in a locking mode in which the component element of which the movement is to be limited is fundamentally restricted in terms of its range of movement, or fixed or locked. This is advantageous for example for transport of the corresponding component or in the event of maintenance work, since in these cases, undefined and/or high external forces should be expected to act, and these forces could result in damage to the movably mounted component element, such that the range of movement is limited from the outset and the component element is fixed.

For this purpose, in the embodiment which is shown in subfigures a) and b) in FIG. 6, the permanent magnet 43, which is arranged on the supporting structure 4, is mounted movably in the supporting structure 4 such that the distance from the permanent magnet 42 arranged opposite, which is arranged on the mirror 1, can be changed. Thus, the repulsive force which is exerted between the permanent magnets 42 and 43 with like poles pointing toward one another can be increased considerably, in order in this way to fix the mirror 1, when, for example, several such pairs of permanent magnets 42, 43 are provided in an encircling manner around the mirror 1, as for example in the embodiment in FIG. 4.

In subfigure a) in FIG. 6, the position of the permanent magnet 43 in the securing mode is shown, in which the distance between the permanent magnets 42 and 43 is so large that, in normal operation, only small repulsive forces can be formed, while in subfigure b), the permanent magnet 43 is arranged in an extended position such that the distance between the permanent magnets 42 and 43 is reduced and a much stronger repulsive force is generated between the permanent magnets 42 and 43 and thus between the mirror 1 and the supporting structure 4.

FIG. 7 shows, in subfigures a) and b), a further embodiment of a movement limiting apparatus, which includes at least one pair of permanent magnets 52 and 53, which are arranged on the mirror 1 and on a supporting structure 4, respectively. In the embodiment in FIG. 7, the permanent magnet 53, which is arranged on the supporting structure 4, is formed in a rotatable manner in order for it to be possible to change the orientation of the permanent magnet 53. Thus, the permanent magnet 53 can be rotated in the securing mode in normal operation such that none of the magnetic poles is directed toward the magnetic pole of the permanent magnet 52, which is oriented from the mirror 1 in the direction of the supporting structure 4. As a result, only small resulting forces, if any, are generated between the permanent magnets 52 and 53, or between the mirror 1 and the supporting structure 4. In the securing case of the securing mode or in the locking mode, the permanent magnet 53 can be rotated in order to be oriented with one of its poles toward the opposite pole of the corresponding permanent magnet 52 on the mirror 1. For example, like poles, such as the south poles shown, can be oriented toward one another in order to generate repulsive forces.

The rotation of the permanent magnet 53 can be brought about by a control and/or regulating device 54 via the signal line 56, with the aid of which the movement limiting apparatus can also be switched for example into the locking state.

For the securing case in the securing mode, that is to say when unexpected external forces, for example as a result of an earthquake or the like, act on the component according to the disclosure, an excessive acceleration or an impermissible change in position is sensed via a sensor 55, which is arranged on the mirror 1, such that the control and/or regulating device 54 can trigger the rotation of the permanent magnet 53 after the sensor signal has been received via the sensor line 57. To this end, the permanent magnet 53 can be preloaded for example in a particular position which is activated by the corresponding triggering by the control and/or regulating device and results directly in the desired rotation of the permanent magnet 53.

In addition to the examples shown in FIGS. 1 to 6, in which, in the securing mode, in the securing case, the corresponding forces for limiting the movement of the movably mounted component element are set automatically on account of magnets that are arranged in a mutually repelling manner or charged electrodes approaching one another, the exemplary embodiment in FIG. 7 represents an embodiment in which, as a result of at least one component that provides a magnetic field and/or electric field (in the exemplary embodiment shown a permanent magnet) being changed, the change in the force field for ensuring the limiting of movement is brought about. In addition to the mechanical adjustment, shown in FIG. 7, of a corresponding component, such as a permanent magnet, other changes, such as setting a magnetic field in a different way via an electromagnet or changing an electric field by charging an electrode in a different way, are also conceivable.

Furthermore, it is also possible to combine different components of a movement limiting apparatus, for example permanent magnets, electromagnets, electrodes or the like, with one another such that the force fields that are for the respective operating state are set by superposing corresponding magnetic and/or electric fields.

An example is illustrated in FIG. 8, in which, in a plan view similar to FIG. 4, a mirror 1 is illustrated in which two pairs of permanent magnets of a movement limiting apparatus are shown, wherein the permanent magnets 2 and 3 are arranged on the mirror 1 (permanent magnets 2) and on a supporting structure (not shown), respectively, and are oriented with like poles toward one another such that repulsive forces act. In addition, an electromagnet 31 is provided, which is configured with regard to a ferromagnetic plate 30, which is arranged on the mirror 1, in order to be able to exert an attractive force on the mirror 1 in addition to the repulsive forces on account of the pairs of permanent magnets 2, 3. This can either be used to compensate for the repulsive forces by the pairs of magnets 2, 3, in order to limit the forces that act on the mirror 1 in the securing mode in normal operation or to fix the mirror 1 in the locking mode or in the securing mode, in the securing case, by the distance between the permanent magnets 2 and 3 being reduced by the attractive force of the electromagnet 31 such that a force equilibrium of forces acting strongly on the mirror 1 exists, such that the freedom of movement of the mirror 1 is restricted.

A movement limiting apparatus, as has been described in part in FIGS. 1 to 8, can be used not only to limit changes in position of a movably mounted component element on account of external forces, but can additionally contribute to avoiding changes in shape of the movably mounted component element, for example as a result of natural oscillations of the component element. In this case, the movement limiting apparatus can in particular have so many field generating components that the limiting of movement or locking is statically overdetermined, in order for it to be possible to counteract the natural oscillations. The arrangement of the field generating components can in this case be based on the deformation of the movable component element by the natural oscillations. In order to avoid oscillations of the component element on account of the forces that occur, at least one component of a movement limiting apparatus, for example a permanent magnet, an electromagnet or an electrode, can be mounted in an elastic and/or damped manner, as is illustrated for example in FIGS. 9 and 10. FIGS. 9 and 10 show the mounting of permanent magnets 63 and 73, respectively, on the supporting structure 4, wherein an elastic spring 60 and a damping member 61 are arranged between the supporting structure 4 and the permanent magnet 63 in order to allow an elastic and damped reaction of the permanent magnet 63 in the event of forces on the permanent magnet 63. Various known damping elements are suitable as damping element 61, for example including damping elements based on magnetorheological fluids.

As shown in FIG. 10, a corresponding damping element 70 can have an encapsulation 71, in order to be suitable for the vacuum conditions which can prevail for example in projection exposure apparatuses. Accordingly, the permanent magnet 73 is mounted on the supporting structure 4 via an encapsulated damping element 70.

Figure 11:
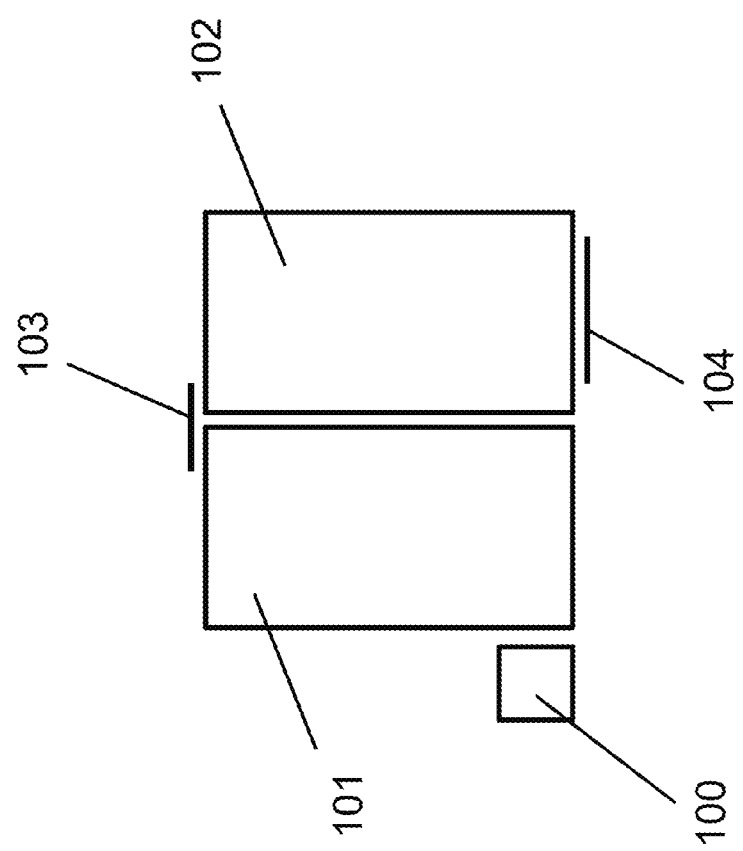
FIG. 11 shows a schematic illustration of a projection exposure apparatus in which the present disclosure can be used.

FIG. 11 shows, in a purely schematic illustration, a projection exposure apparatus in which a corresponding component can be operated with a movement limiting apparatus or with a method for limiting movement. The projection exposure apparatus includes a light source 100, an illumination unit 101 and a projection lens 102. Via the illumination unit 101, a reticle 103 which bears the structures to be imaged is illuminated, and by way of the projection lens 102, the structures of the reticle 103 are imaged in a scaled-down manner on a wafer 104 such that the wafer 104 can form the corresponding structures of the reticle 103 by microlithographic processes.

Although the present disclosure has been described in detail by way of the exemplary embodiments, it is obvious to a person skilled in the art that the disclosure is not restricted to this exemplary embodiment but rather that modifications are possible such that individual features can be omitted or different types of combinations of features can be realized, as long as there is no departure from the scope of protection of the appended claims. The present disclosure includes all combinations of the individual features presented.

What is claimed is:

1. A method of limiting movement of a movably mounted component element of a component of a microlithographic projection exposure apparatus, the component comprising the movably mounted component element and a bearing element supporting the movably mounted component element and defining a position of the movably mounted component element within a permissible range of movement, the method comprising:
    providing a movement limiting apparatus which limits for changes in a position of the movably mounted component element outside a permissible range of movement, the movement limiting apparatus comprising a field generating device comprising first and second members, the first member being arranged on the movably mounted component element, the second member arranged on a supporting structure with respect to which the movement of the movably mounted component element is intended to be limited, the first and the second members are at a distance from each other and a magnetic and/or electric field is generated by each of the first and the second members so that a force field is formed between the first and the second components;
    setting the force field so that, when the position of the movably mounted component changes beyond the permissible range of movement as a result of undesired external forces, the change in position is counteracted by the force acting between the first and second members, wherein:
    the movement limiting apparatus has a first operation state and a second operation state;
    in the first operation state of the movement limiting apparatus: a) the projection exposure apparatus is operated to image structures of a reticle; and b) the movably mounted component element is movable in the permissible range of movement; and
    in the second operation state of the movement limiting apparatus: a) the projection exposure apparatus is not operated to image structures of a reticle; and b) the movement limiting apparatus is used to lock the movably mounted component element.

2. The method of claim 1, wherein normal operation of the movement limiting device occurs when the distance between the first and second member is greater than or equal to a target distance which is accordingly within the permissible range of movement.

3. The method of claim 1, wherein normal operation of the movement limiting device occurs when acceleration of the movably mounted component element is beneath a threshold value.

4. The method of claim 1, wherein normal operation of the movement limiting device occurs when an external force action is beneath a limit.

5. The method of claim 1, wherein:
    the force acting between the first and second members is less than or equal to a limit value in normal operation; and
    the limit value is less than a bearing force of the bearing element for the movably mounted component element.

6. The method of claim 1, wherein:
    the force acting between the first and second components is less than or equal to a limit value in normal operation; and
    in the first operation state of the movement limiting apparatus, the force field is changed due to the action of external forces.

7. The method of claim 1, wherein, in the second operation state of the movement limiting apparatus, a field-generating member that generates a field is switched into a latching state, and the field is a magnetic field and/or an electric field.

8. The method of claim 7, wherein at least one of the following holds:
    the field-generating member is mechanically adjusted;
    the field is switched off; and
    in each case, at least one force field that attracts the first and second members to each other and a repulsive force field are superposed.

9. A component of a microlithographic projection exposure apparatus, comprising:
    a movably mounted component element;
    a bearing element supporting the component element and defining a position of the component element within a permissible range of movement; and
    a movement limiting apparatus configured to limit possibilities for changes in position of the component element outside a permissible range of movement,
wherein:
    the movement limiting apparatus comprises a field generating device comprising first and second members;

the first member is arranged on the movably mounted component element;

the second member is arranged on a supporting structure with respect to which the movement of the movably mounted component element;

the first and second members are a distance from each other; and the first and second members are configured so that a magnetic and/or electric field is generatable by each of the first and second members so that a force field is present between the first and second members so that the force field counteracts the change in position of the movably mounted component element at least outside the permissible range of movement;

the force field is set so that the force exerted on the movably mounted component element by the movement limiting apparatus is less than or equal to a limit value in normal operation;

the limit value is less than a bearing force of the bearing element for the movably component element;

the force field is switchable between first and second operating state;

in the first operating state, the movably mounted component element is movably in the permissible movement range; and in the second operating state, the movably mounted component element has restricted movement.

10. The component of claim 9, wherein the component is configured so that the limit value is kept within by superimposition of magnetic and/or electric fields.

11. The component of claim 9, wherein the movement limiting apparatus comprises several members configured to limit the movement of the movably mounted component element in several degrees of freedom of movement.

12. The component of claim 11, wherein the several members comprise an element selected from the group consisting of permanent magnets, electromagnets and electrodes.

13. The component of claim 11, wherein at least one of the several members comprises an elastic element and/or a damping element.

14. The component of claim 9, wherein the movement limiting apparatus comprises several pairs of members configured to limit the movement of the movably mounted component element in several degrees of freedom of movement.

15. The component of claim 9, comprising a field-generating member configured to generate at least one field selected from the group consisting of a magnetic field and an electric field, wherein the field-generating member is mechanically adjustable, and/or the member is adjustable with regard to the field.

16. The component of claim 9, wherein the first and second members comprise a pair of interacting members selected from the group of pairings consisting of: a) two permanent magnets; b) a permanent magnet and an electromagnet; c) two electromagnets; and d) two electrodes.

17. An apparatus, comprising:
a component according to claim 9,
wherein the apparatus is a microlithographic projection exposure apparatus.

18. A component, comprising:
a movably mounted component element;
a bearing element supporting the movably mounted component element and defining a position of the movably mounted component element within a permissible range of movement; and
a movement limiting apparatus configured to limit possibilities for changes in the position of the movably mounted component element outside a permissible range of movement,
wherein:
the movement limiting apparatus comprises a magnetic field generating device comprising first and second permanent magnets;
the first permanent magnet is arranged on the movably mounted component element;
the second permanent magnet is arranged on a supporting structure with respect to which movement of the movably mounted component element is to be limited;
the first and second permanent magnets are configured so that they are orientable with like magnetic poles pointing toward one another.

19. The component of claim 18, further comprising an electromagnet assigned to the first and second permanent magnets.

20. An apparatus, comprising:
a component according to claim 18,
wherein the apparatus is a microlithographic projection exposure apparatus.

21. The method of claim 1, further comprising setting the force field so that a force acting between the first and second members does not influence the positioning of the movably mounted component element.

* * * * *

UNITED STATES PATENT AND TRADEMARK OFFICE
CERTIFICATE OF CORRECTION

PATENT NO. : 10,095,126 B2
APPLICATION NO. : 15/659205
DATED : October 9, 2018
INVENTOR(S) : Jens Prochnau, Marwène Nefzi and Dirk Schaffer Page 1 of 1

It is certified that error appears in the above-identified patent and that said Letters Patent is hereby corrected as shown below:

In the Specification

Column 9, Line 10, delete "disclosure," and insert -- disclosure; --.

In the Claims

Column 15, Line 51, in Claim 1, delete "limits" and insert -- limits, --.

Column 18, Line 8-9, in Claim 16, delete "electro-magnet;" and insert -- electromagnet; --.

Signed and Sealed this
Ninth Day of April, 2019

Andrei Iancu
*Director of the United States Patent and Trademark Office*